US008589755B2

(12) United States Patent
Djordjevic et al.

(10) Patent No.: US 8,589,755 B2
(45) Date of Patent: Nov. 19, 2013

(54) REDUCED-COMPLEXITY LDPC DECODING

(75) Inventors: Ivan B. Djordjevic, Tucson, AZ (US); Lei Xu, Princeton Junction, NJ (US); Ting Wang, West Windsor, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 227 days.

(21) Appl. No.: 13/114,793

(22) Filed: May 24, 2011

(65) Prior Publication Data

US 2011/0314352 A1  Dec. 22, 2011

Related U.S. Application Data

(60) Provisional application No. 61/355,361, filed on Jun. 16, 2010.

(51) Int. Cl.
*H03M 13/00* (2006.01)
*G06F 11/00* (2006.01)

(52) U.S. Cl.
USPC ............................ 714/758; 714/755; 714/801

(58) Field of Classification Search
USPC .......... 714/755, 758, 795, 801, 752; 375/262, 375/341
See application file for complete search history.

(56) References Cited

U.S. PATENT DOCUMENTS

| | | | | |
|---|---|---|---|---|
| 7,246,297 | B2 * | 7/2007 | Zarrinkhat et al. | 714/755 |
| 7,251,769 | B2 * | 7/2007 | Ashikhmin et al. | 714/755 |
| 8,245,098 | B2 * | 8/2012 | Han et al. | 714/752 |
| 8,307,253 | B2 * | 11/2012 | Gunnam | 714/752 |
| 8,312,312 | B2 * | 11/2012 | Oikawa et al. | 714/4.1 |
| 8,327,235 | B2 * | 12/2012 | Gunnam | 714/780 |
| 8,359,522 | B2 * | 1/2013 | Gunnam et al. | 714/758 |
| 2010/0042891 | A1 * | 2/2010 | Gunnam et al. | 714/752 |
| 2010/0042893 | A1 * | 2/2010 | Gunnam | 714/752 |
| 2010/0042904 | A1 * | 2/2010 | Gunnam | 714/780 |
| 2011/0264979 | A1 * | 10/2011 | Gunnam et al. | 714/752 |

OTHER PUBLICATIONS

J. Chen, et al., "Reduced-Complexity Decoding of LDPC Codes", IEEE Transactions on Communications, vol. 53, No. 8, Aug. 2005, 31 pages.
M. Fossorier, "Reduced Complexity Iterative Decoding of Low-Density Party Check Codes Based on Belief Propagation", IEEE Transactions on Communications, vol. 47, No. 5, May 1999, pp. 673-680.

* cited by examiner

*Primary Examiner* — Phung M Chung
(74) *Attorney, Agent, or Firm* — Joseph Kolodka; James Bitetto

(57) ABSTRACT

Methods and systems for reduced-complexity decoding of low-density parity-check (LDPC) information. An encoded input stream is received. The received stream is decoded with one or more reduced-complexity min-sum or a posteriori probability LDPC decoders. A v-node update rule in the reduced complexity decoder is omitted.

16 Claims, 9 Drawing Sheets

REDUCED-COMPLEXITY LDPC DECODING

RELATED APPLICATION INFORMATION

This application claims priority to provisional application Ser. No. 61/355,361 filed on Jun. 16, 2010, incorporated herein by reference.

BACKGROUND

1. Technical Field

The present invention relates to forward error correction (FEC) for high-speed serial optical transport and, in particular, to systems and methods for reduced-complexity FEC decoding with low-density parity check codes.

2. Description of the Related Art

In the recent years, with the rapid growth of data-centric services and the general deployment of broadband access networks, the dense wavelength division multiplexing (DWDM) network has been upgraded from 10 Gb/s per channel to more spectrally-efficient 40 Gb/s or 100 Gb/s per channel systems and beyond. 100 Gb/s Ethernet (100 GbE) has recently been standardized. As the communication rate over a given medium increases, transmission becomes increasingly sensitive to errors due to various linear and nonlinear channel impairments such as chromatic dispersion, polarization mode dispersion, and fiber nonlinearities. The Shannon limit for a noise-influenced channel describes a maximum amount of error-free data that can be transmitted with a specified bandwidth—it is therefore helpful to have robust codes and modulation schemes that closely approach the Shannon limit without imposing high requirements in terms of implementation cost and complexity.

Random low-density parity-check (LDPC) codes are difficult to implement because of the lack of regular structure in their parity check matrices. Indeed, implementing a sum-product algorithm to decode LDPC codes at 40 Gb/s is challenging with state-of-the-art very-large-scale integration (VLSI) technologies.

SUMMARY

A method for decoding low-density parity-check (LDPC) information is shown that includes receiving an encoded input stream and decoding the encoded input stream with one or more reduced-complexity min-sum LDPC decoders. Decoding the encoded input stream includes initializing variable-nodes based on channel reliabilities; and performing attenuated check-node updates based on said variable-node reliabilities. The decoding does not update variable-nodes.

A receiver is shown that includes a detector configured to receive an input stream and produce a stream of samples corresponding to encoded bits; and one or more reduced-complexity min-sum LDPC decoders configured to initialize variable-nodes based on channel reliabilities and to perform attenuated check-node updates based on said variable-node reliabilities to decode the encoded bits. The reduced-complexity min-sum LDPC decoders are configured not to update variable-nodes.

A method for decoding low-density parity-check information is shown that includes receiving an encoded input stream and decoding the encoded input stream with one or more reduced-complexity a posteriori probability (APP) LDPC decoders. Decoding the encoded input stream includes initializing hard decisions and variable-node magnitudes based on channel reliabilities and performing attenuated check-node updates based on said hard decisions and magnitudes. The decoding does not update variable-nodes.

A receiver is shown that includes a detector configured to receive an input stream and produce the samples that correspond to encoded bits and one or more reduced-complexity APP LDPC decoders configured to initialize hard decisions and variable-node magnitudes based on channel reliabilities and to perform attenuated check-node updates based on said hard decisions and variable-node magnitudes to decode the encoded bits. The reduced complexity APP decoders are configured not to update variable-nodes.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Rather than attempting to reduce the complexity of check-node update rules, where imperfect approximations lead to significant reductions in bit-error rate (BER) performance, the present principles reduce the complexity of variable-node updating. Several exemplary reduced-complexity (RC) low-density parity check (LDPC) decoding methods according to the present principles are provided. These include RC min-sum and RC a posterior probability (APP). Even if the variable-node update rule is completely eliminated, only modest degradations in BER are seen when large-girth LDPC codes are used. As a result, the present principles provide decoding methods which omit variable-node updates, thereby substantially reducing decoding complexity without substantial loss.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory (RAM), a read-only memory (ROM), a rigid magnetic disk and an optical disk, etc.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 1:
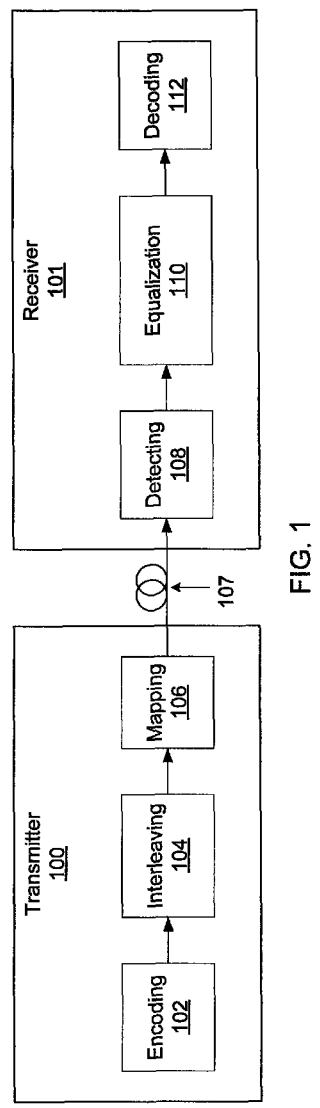
FIG. 1 shows a block diagram illustrating an optical transmission system in accordance with one illustrative embodiment.

Referring now to the drawings in which like numerals represent the same or similar elements and initially to FIG. 1, an optical communications system is shown comprising a transmitter 100 and a receiver 101. The transmitter encodes a plurality of data signals at the encoder block 102 and then interleaves those signals at interleaving block 104. The mapping block 106 then assigns bits of the interleaved signal to an iterative polarization modulation constellation, associating the bits of the interleaved data signals with the coordinates of points on an iterative polar quantization (IPQ) constellation. The transmitter 100 then sends the signal to receiver 101 over an optical medium 107, which may include periodically deployed erbium doped fiber (EDF) amplifiers to maintain the signal strength. Other embodiments include the use of Raman and hybrid Raman/EDF amplifiers or wholly non-optical systems. Receiver 101 detects symbols in the IPQ constellation at block 108. A backpropagation and equalization block 110 performs coarse digital backpropagation and turbo equalization to compensate for channel impairments such as polarization mode dispersion, chromatic dispersion, and fiber non-linearities. The signals are then de-interleaved and decoded at block 112 to produce the original data signals.

The encoders and decoders make use of LDPC codes to provide error correction that brings the transmissions close to the channel capacity. Several definitions will be employed below to describe RC LDPC decoding. A regular (n, k) LDPC code is a linear block code whose parity-check matrix H includes exactly $W_c$ 1 s per column and exactly $W_r=W_c(n/(n-k))$ 1 s per row, where $W_c \ll (n-k)$. The n term represents the total number of bits in a coded word produced by the LDPC code, while the k term represents the number of information bits encoded by the code word. Choice of parity matrix can greatly affect the effectiveness of the LDPC code.

Decoding of LDPC codes is based on a sum-product algorithm (SPA), which is an iterative decoding algorithm that iterates extrinsic probabilities forward and back between variable- and check-nodes of bipartite (e.g., Tanner) graph representations of the parity-check matrix H. The Tanner graph of an LDPC code is drawn according to the following rule: check node c is connected to variable node v whenever element $h_{cv}$ in H is a 1. For variable-node v and check-node c the neighborhoods N(v) and N(c) are defined as the set of check-nodes and variable nodes connected to the variable nor or check node (respectively) in question.

Figure 2:
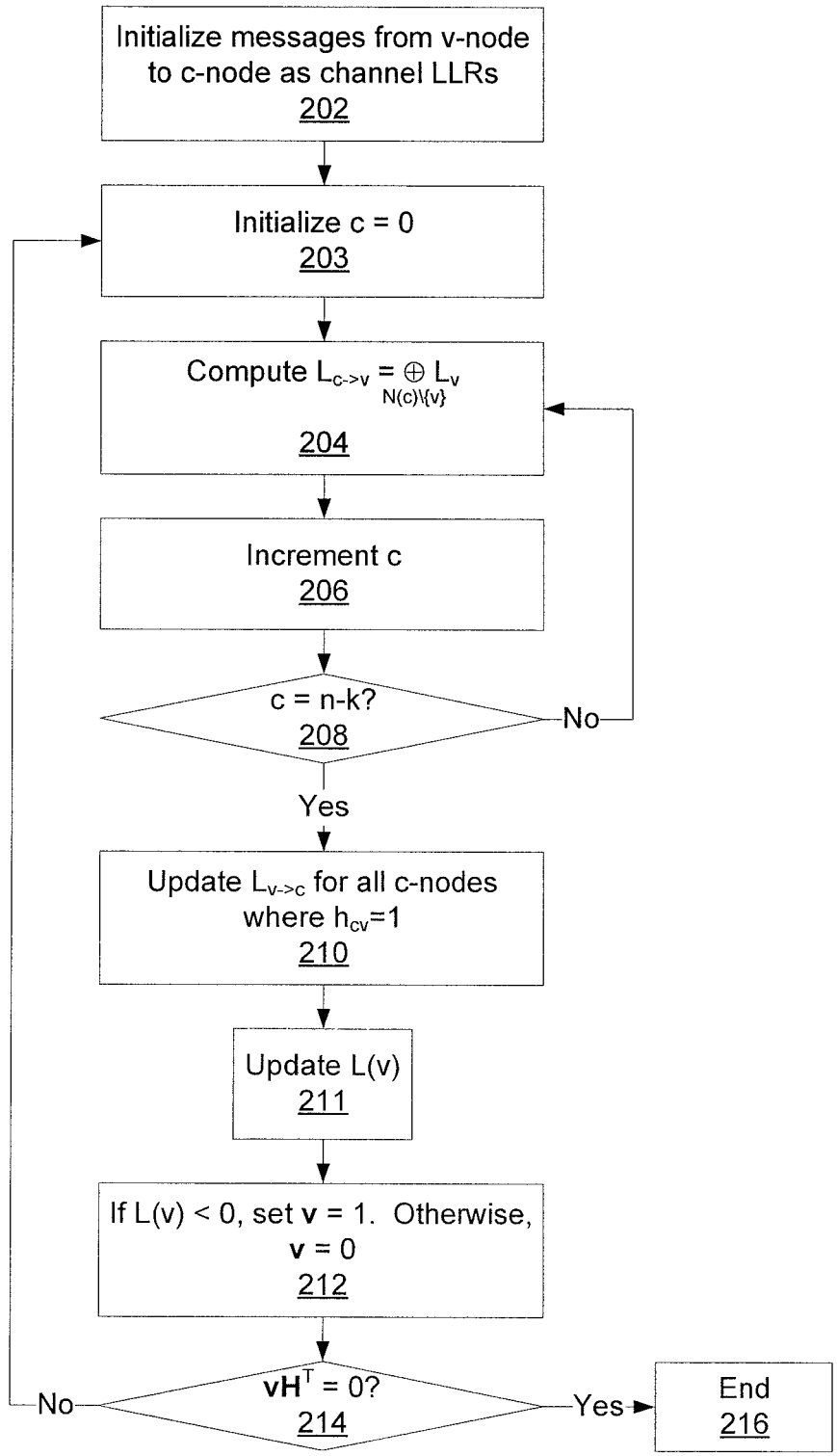
FIG. 2 shows a block/flow diagram that illustrates a Gallagher sum-product method for decoding low-density parity-check (LDPC) codes.

Referring now to FIG. 2, an exemplary Gallagher SPA is shown. Block 202 initializes messages $L_{v \to c}$ to be sent from variable-node v to check-node c as channel log-likelihood ratios (LLRs) $L_{ch}(v)$. Channel LLRs are defined by $$L_{ch}(v) = \log [P(v=0|y)/P(v=1|y)],$$

where y is the channel sample and the probability terms refer to the likelihood of the channel sample being a 0 or a 1 respectively. For example, for asymmetric additive white Gaussian noise (AWGN) channels, $$L_{ch}(v) = \log(\sigma_1/\sigma_0) - (y-\mu_0)^2/2\sigma_0^2 + (y-\mu_1)^2/2\sigma_1^2,$$

where the values of µ and σ are determined by propagating a training sequence, while for a symmetric AWGN channel, $$L_{ch}(v) = 2y/\sigma^2.$$

Block 203 begins check-node updating by initializing a counter c for the check-nodes. Block 204 computes the messages $L_{c \to v}$ to be sent from the check-node c to the variable-node v as the application of a ⊕-operator over the neighborhood of check-node c excluding the variable-node v:

$$L_{c \to v} = \bigoplus_{N(c) \setminus \{v\}} L_{v \to c}.$$

The ⊕-operator is defined for the Gallagher SPA by $$L_1 \oplus L_2 = \prod_{k=1}^{2} \text{sign}(L_k) \phi\left(\sum_{k=1}^{2} \phi(|L_k|)\right),$$

where φ(x)=−log(tan h(x/2)). Block 206 then increments the counter c and block 208 checks whether c has reached n−k. If not, processing returns to block 204 to handle the next check-node. If so, processing goes on to update the variable-nodes.

Block 210 calculates a new $L_{v \to c}$ for each variable-node v as $$L_{v \to c} = L_{ch}(v) + \sum_{N(v) \setminus \{c\}} L_{c \to v}$$

for every c node where $h_{cv}=1$. Block 211 updates the log-likelihood ratio for variable-node v (corresponding to the likelihood of a given bit being one or zero) for all v as:

$$L(v) = L_{ch}(v) + \sum_{N(v)} L_{c \to v}.$$

If L(v)<0, decision v̂ corresponding to the transmitted bit value of v is set to 1, otherwise v̂=0. Decision block 214 determines whether $\hat{v}H^T=0$. If so, processing ends at block 216. Otherwise processing returns to check-node updating at block 203.

The Gallagher SPA's check-node update rule involves both a logarithm and a hyperbolic tangent, making it computationally intensive. As such, approximations are used to reduce the processing burden. One such approximation is the min-sum-plus-correction-term approximation. It can be shown that the ⊕ operator can also be calculated as:

$$L_1 \oplus L_2 = \prod_{k=1}^{2} \text{sign}(L_k) \min(|L_1|, |L_2|).$$

The c(x, y) term denotes a correction factor defined by:

$$c(x,y) = \log[1+\exp(-|x+y|)] - \log[1+\exp((-|x-y|)],$$

which may be implemented as a lookup table (LUT).

Figure 3:
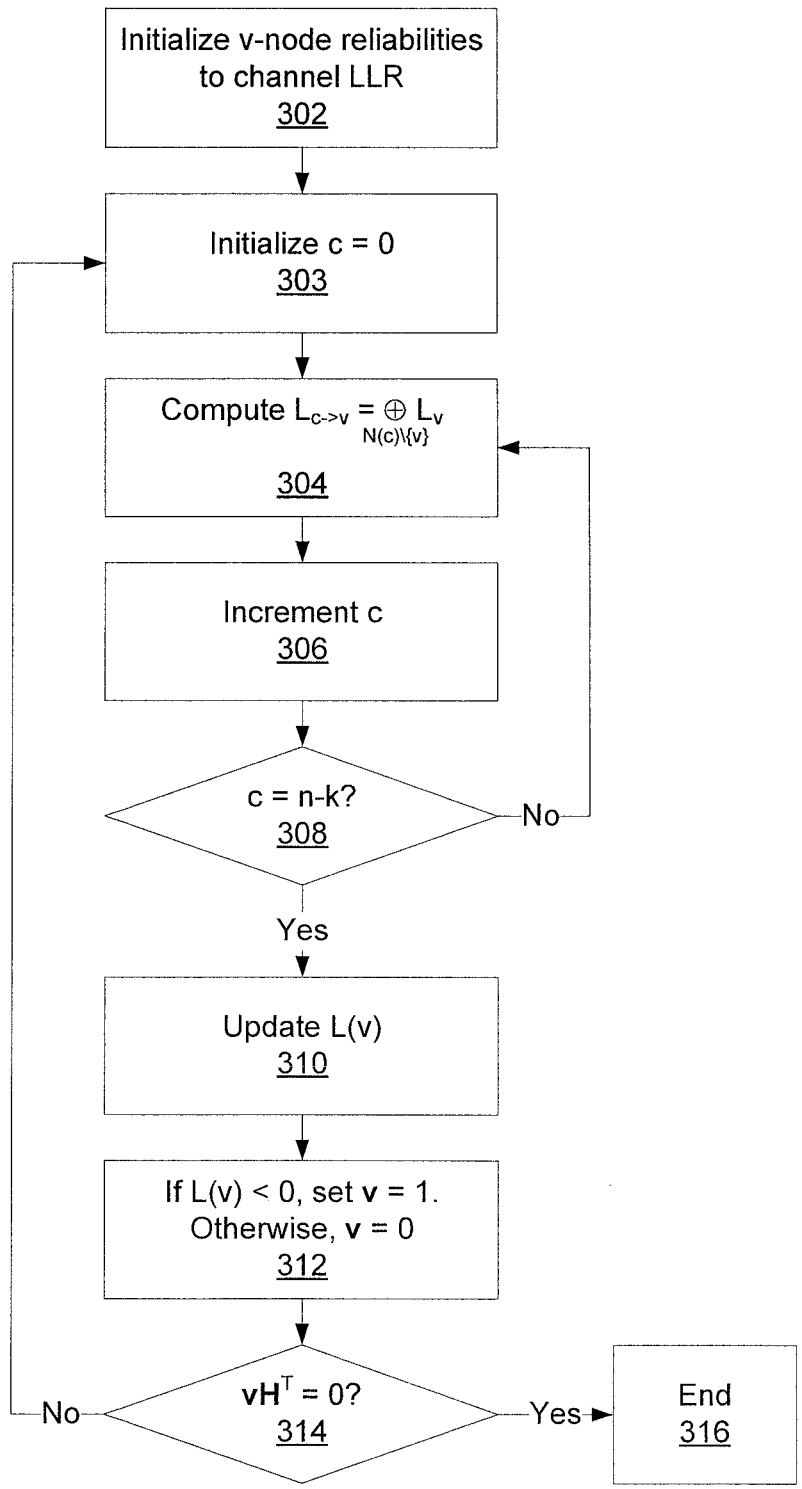
FIG. 3 shows a block/flow diagram that illustrates a reduced complexity (RC) min-sum method for decoding LDPC codes in accordance with one illustrative embodiment.

Referring now to FIG. 3, an exemplary RC min-sum method is shown. It is clear from FIG. 2 that the computational burden of check-node updating is much higher than that of variable-nodes, while memory storage needs are comparable. Because variable-node update is not as important to decoding as the check-node update, the present principles allow for its complete elimination. To compensate for BER loss due to the elimination of variable-node updates (which makes the operation overconfident), the check-code update rule may be re-formulated by introducing an attenuation factor. By properly attenuating the ⊕-operator, accuracy is substantially improved.

Block 302 initializes variable-node reliabilities to channel node reliabilities as $L_v = L_{ch}(v)$. Block 303 begins the new check-node update by initializing a counter c to zero. Block 304 computes the messages $L_{c \rightarrow v}$ from the check-nodes to the variable-nodes as in block 204 above, $$L_{c \rightarrow v} = \bigoplus_{N(c) \setminus \{v\}} L_{v \rightarrow c}.$$

In block 304, however, the ⊕ is applied using an RC min-sum definition:

$$L_1 \oplus L_2 = \alpha \prod_{k=1}^{2} \text{sign}(L_k) \min(|L_1|, |L_2|),$$

where $\alpha$ is an attenuation factor. Block 306 then increments the counter c, and block 308 determines whether c has reached n−k. If so, processing continues to block 310. If not, processing returns to block 304.

As in FIG. 2, block 310 updates L(v) and block 312 determines whether each reliability L(v) is less than zero. If so, a unit vector $\hat{v}$ corresponding to v is set to 1, and if not $\hat{v}=0$. Block 314 determines whether $\hat{v}H^T=0$. If so, processing ends at block 316. Otherwise processing returns to check-node updating at block 303.

Figure 4:
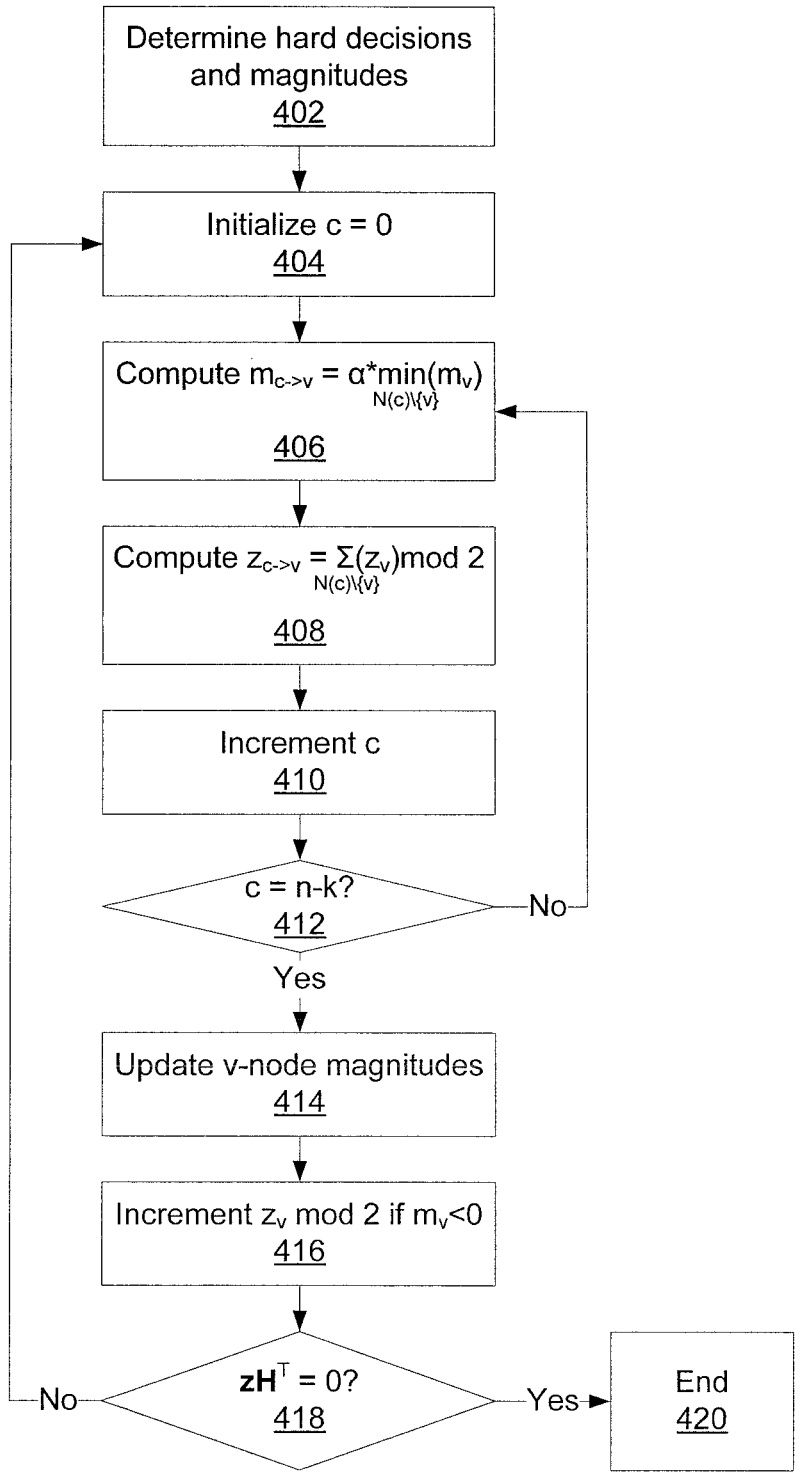
FIG. 4 shows an RC a posteriori probability method for decoding LDPC codes in accordance with one illustrative embodiment.

Referring now to FIG. 4, another RC decoding method according the present principles is shown as being an RC a posteriori probability (APP) method. RC-APP is independent of channel assumptions and removes the computationally extensive non-linear steps of regular APP. Block 402 initializes hard decisions to $$z_v = \frac{1-\text{sign}(L_{ch}(v))}{2},$$

and the magnitudes to $$m_v = |L_{ch}(v)|.$$

Block 404 initializes a counter c to zero to begin check-node updating. Block 406 computes magnitudes to be sent from check-node c to variable-node v as $$m_{c \rightarrow v} = \alpha \left( \min_{N(c) \setminus \{v\}} m_v \right).$$

The hard decision from check-nodes c to variable-node v are then computed in block 408 as $$z_{c \rightarrow v} = \left( \sum_{N(c) \setminus \{v\}} z_v \right) \text{mod } 2.$$

Block 410 increments c and block 412 checks whether c equals n−k. If not, processing returns to block 406 to process the next check-node. If so, processing continues to bit decision in block 414.

Block 414 updates variable-node magnitudes as $$m_v = |L_{ch}(v)| + \sum_{N(c)} (1 - 2z_{c \rightarrow v}) m_{c \rightarrow v}$$

for all v. Block 416 then increments the hard decision $z_v$ modulo 2 for each $m_v$ that is less than zero. If $zH^T=0$, block 418 ends processing. Otherwise, processing returns to block 404. In this way, the method repeats until it converges. RC-APP only needs summators, comparators, and mod 2 adders. Even the attenuations can be implemented by appropriate register shifts (where, e.g., an attenuation factor of 0.5 corresponds to one register shift to the right).

In our simulations, it has been found that the min-sum-plus-correction-term decoding suffers negligible performance loss as compared to Gallagher SPA. Min-sum decoding with an optimal attenuation factor of $\alpha=0.8$ performs the same as Gallagher SPA, while RC min-sum with an attenuation factor of 0.44 faces only 0.45 dB degradation at a BER of $10^{-9}$. The storage complexity and latency of optimally attenuated RC min-sum and RC-APP decoding are much lower, making it a suitable candidate for 40 Gb/s systems. The conclusions above are valid for large-girth LDPC codes.

Quantization effects also influence the BAR performance of the different encoders. When four bits are used, including three bits for magnitude and one bit for sign, there is only a 0.05 dB loss for the 0.8-min-sum and 0.4-RC-APP decoders at a BER of $10^{-7}$. When three bits are used, the corresponding degradations are 0.26 and 0.36 dB respectively.

Figure 5:
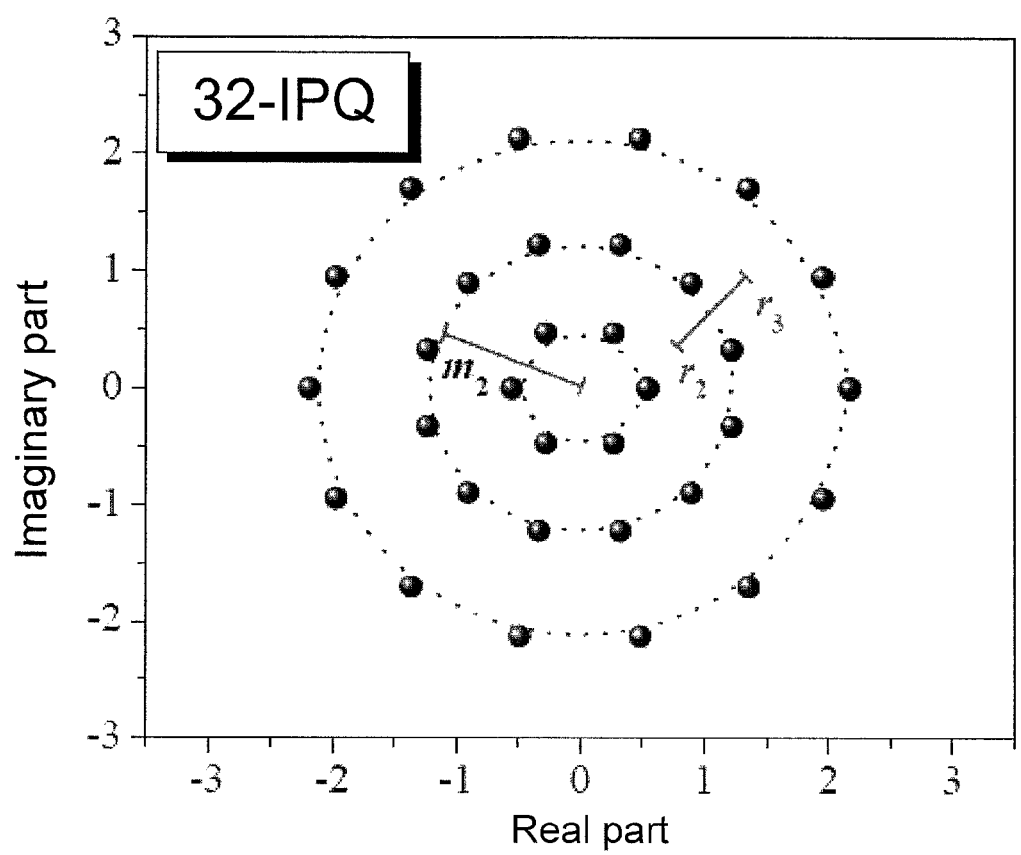
FIG. 5 shows a 32-iterative polar quantization (IPQ) constellation in accordance with one illustrative embodiment.

In addition to LDPC encoding, transmission benefits from the use of an effective modulation scheme. For example, iterative polar quantization (IPQ) produces a non-uniform constellation that fits a Gaussian source distribution and provides superior performance. Referring now to FIG. 5, an exemplary IPQ constellation is shown. The constellation is an example of 32-IPQ, where the axes represent a real (in-phase)

signal and an imaginary (quadrature) signal. The constellation shown in FIG. 5 is represented by Table 1 below:

TABLE 1

| i | 1 | 2 | 3 | 4 |
|---|---|---|---|---|
| $r_i$ | 0 | 0.896 | 1.733 | 4.5 |
| $m_i$ | 0.547 | 1.269 | 2.181 | |
| $L_i$ | 6 | 12 | 14 | | where L is the total number of signal constellation points, $L_i$ is the number of constellation points in each circle having radius $m_i$, and $r_i$ represents limits of integration used in the calculation of the points. The IPQ constellations benefit from a non-uniform distribution, where the points in outer rings are spaced farther apart than the inner rings. This non-uniform distribution provides a better fit to an optimum Gaussian source distribution than a uniform distribution would because it provides superior compensation for the drift in I and Q values that noise introduces. The correspondence between bit sequences and constellation positions may be stored and retrieved from a stored lookup table. The lookup tables are generated in advance by the techniques described above and are included in both the transmitter 100 and the receiver 101.

IPQ constellations are determined based on the minimum quantization mean squared error (QMSE). The optimum source distribution for Gaussian channels, such as ASE noise-dominated channels, is Gaussian. The in-phase $s_I$ and quadrature $s_Q$ components of Gaussian random constellation vector $s=(s_I, s_Q)$ follow a 2-D distribution with zero mean. Corresponding polar coordinates of this signal constellation are given by:

$$s = |s|e^{i\theta},$$
$$|s| = \sqrt{s_I^2 + s_Q^2},$$
$$\theta = \tan^{-1}\frac{s_Q}{s_I},$$

with the distribution of envelope $|s|$ being Rayleigh and the distribution of $\theta$ being uniform.

For a Gaussian source, the distribution of ring radii is selected to be Rayleigh and the signal constellation is obtained by quantizing the source while minimizing QMSE. This is achieved using restricted iterative polarization quantization (IPQ) that includes a non-uniform scalar quantization of the amplitude and a uniform scalar quantization of the phase. The number of points on each ring is selected iteratively for all the concentric rings.

Let $L_i$ denote the number of constellation points per circle of radius $m_i$. The optimum number of constellation points per $i^{th}$ circle is determined by minimizing the QMSE by:

$$L_i = \sqrt[3]{m_i^2 \int_{r_i}^{r_{i+1}} p(r)dr} \bigg/ \left[\sum_{i=2}^{L_r} \frac{1}{L} \sqrt[3]{m_i^2 \int_{r_i}^{r_{i+1}} p(r)dr}\right]; \quad (1)$$
$$i = 1, 2, \ldots, L_r$$

where $L_r$ is the number of circles in the constellation, L is the total number of signal constellation points ($L=\sum_{i=2}^{L_r} L_i$) and p(r) is Rayleigh distribution function for probability $$p(r) = \frac{r}{\sigma^2}e^{-\frac{r^2}{2\sigma^2}}, \text{ for } r \geq 0,$$

where $\sigma^2$ represents the source power.

The radius of the $i^{th}$ ring is determined as:

$$m_i = 2\sin(\Delta\theta_i/2)\int_{r_i}^{r_{i+1}} rp(r)dr/\Delta\theta_i \int_{r_i}^{r_{i+1}} p(r)dr, \quad (2)$$

$$\Delta\theta_i = \frac{2\pi}{L_i}, i = 1, 2, \ldots, L_r.$$

The limits of integration in equations (1) and (2) are determined by:

$$r_i = \pi(m_i^2 - m_{i-1}^2)/2[m_i L_i \sin(\Delta\theta_i/2) - m_{i-1}L_{i-1}\sin(\Delta\theta_{i-1}/2)],$$
$$i = 1, 2, \ldots L_r \quad (3)$$

The Rayleigh distribution is used because the envelope r of a two-dimensional (zero-mean) Gaussian distribution with coordinates $r_I$ and $r_Q$ (representing in-phase and quadrature components), determined by $r=\sqrt{r_I^2+r_Q^2}$, conforms to a Rayleigh probability distribution. As the iterative process proceeds, applying equations (1)-(3) until convergence, the number of rings, the radius of each ring, and the number of points on each ring are determined and stored.

Figure 6:
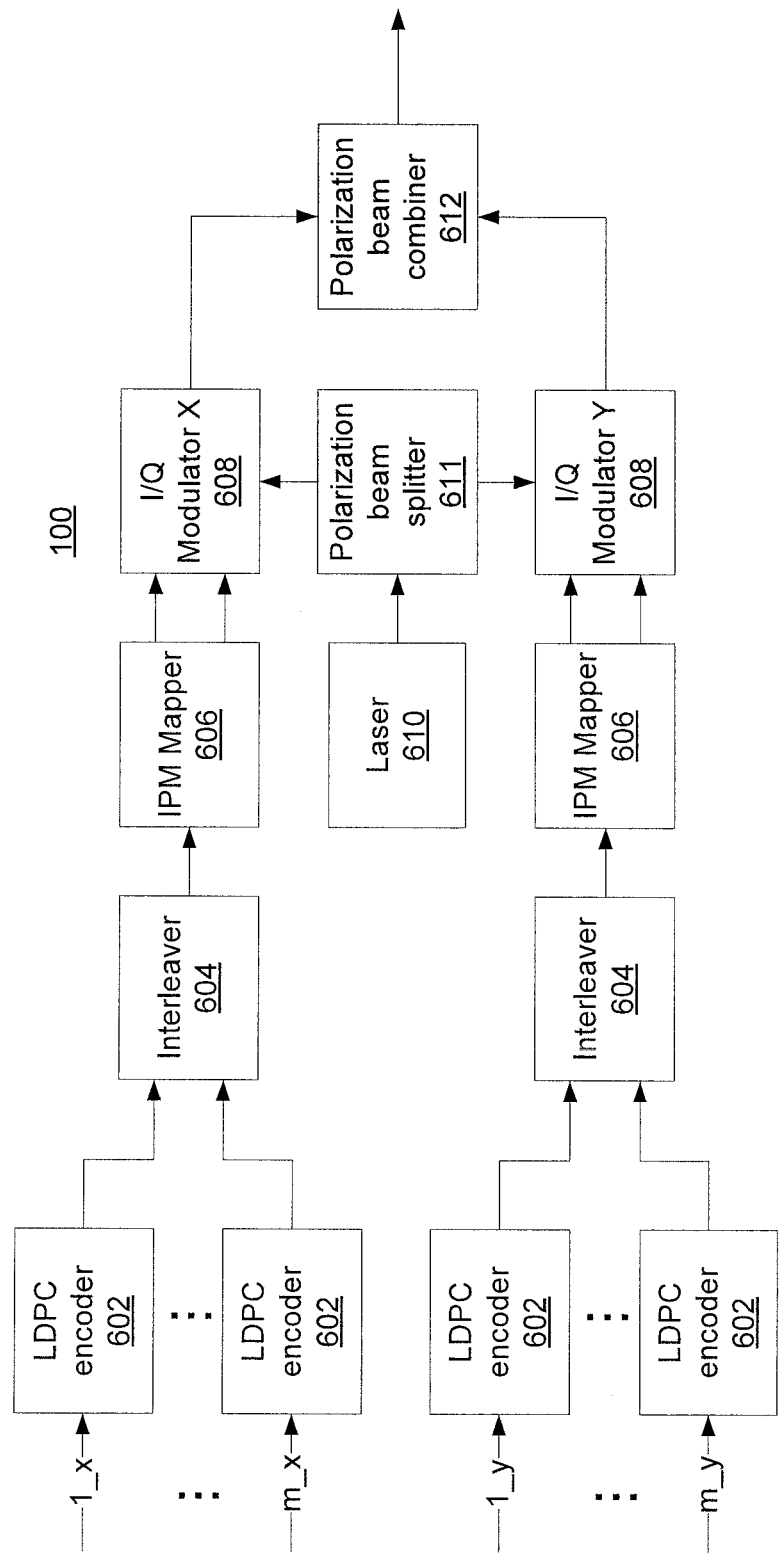
FIG. 6 shows a block diagram illustrating an optical transmitter that employs LDPC codes in accordance with one illustrative embodiment.

Referring now to FIG. 6, a detailed view of transmitter 100 is shown. Although this transmitter is described in the context of an optical system, it is contemplated that the present principles may also be implemented in alternative systems such as electrical, coaxial, and other non-optical communications technologies by those having ordinary skill in the art. 2m data signals feed into the transmitter. The data signals are divided into m signals to be put on an x polarization and m signals for a y polarization. FIG. 6 illustrates two separate branches, one for each of the respective polarization, and m signals for each branch. Although the branches are described herein as having equal numbers of input data signals, the branches may also accept different numbers of inputs. The data streams are encoded at LDPC encoders 602 using different LDPC codes having code rates $R_i=K_i/N(i \in \{x,y\})$, where $K_i$ denotes the number of information symbols used in the binary LDPC code corresponding to each polarization and N denotes the codeword length, where both LDPC codes have the same codeword length.

The 2m input bit streams from 2m different information sources pass through identical LDPC encoders 602 that use, e.g., large-girth quasi cyclic LDPC codes $R_i$ or modified progressive edge growth based codes. The outputs of the encoders are then bit-interleaved by an m×n bit-interleaver 604, where the sequences are written row-wise and read column-wise. The output of the interleaver 604 is sent in one bit-stream, m bits at a time instant i, to a mapper 606.

The mappers 606 map each m bits into a $2^m$-ary IPQ signal constellation point based on a lookup table, as explained above. The mapper 606 assigns bits to constellation points in polar coordinates $s_i=(I_i,Q_i)=|s_i|\exp(j\phi_i)$, with the mapped coordinates from the mapper 606 being used as the inputs of an I/Q modulators 608. A light source, such as a laser 610, produces a carrier beam that is split at polarization beam splitter 611 into two orthogonal polarizations. The I/Q modulators 608 modulate the constellation points onto the orthogonally polarized carrier beams. The beams from the respective branches of the transmitter 100 are then combined in beam combiner 612 before being transmitted on an optical fiber.

Because the combined beams occupy polarizations that are orthogonal with respect to one another, they can be combined without loss of information.

Figure 7:
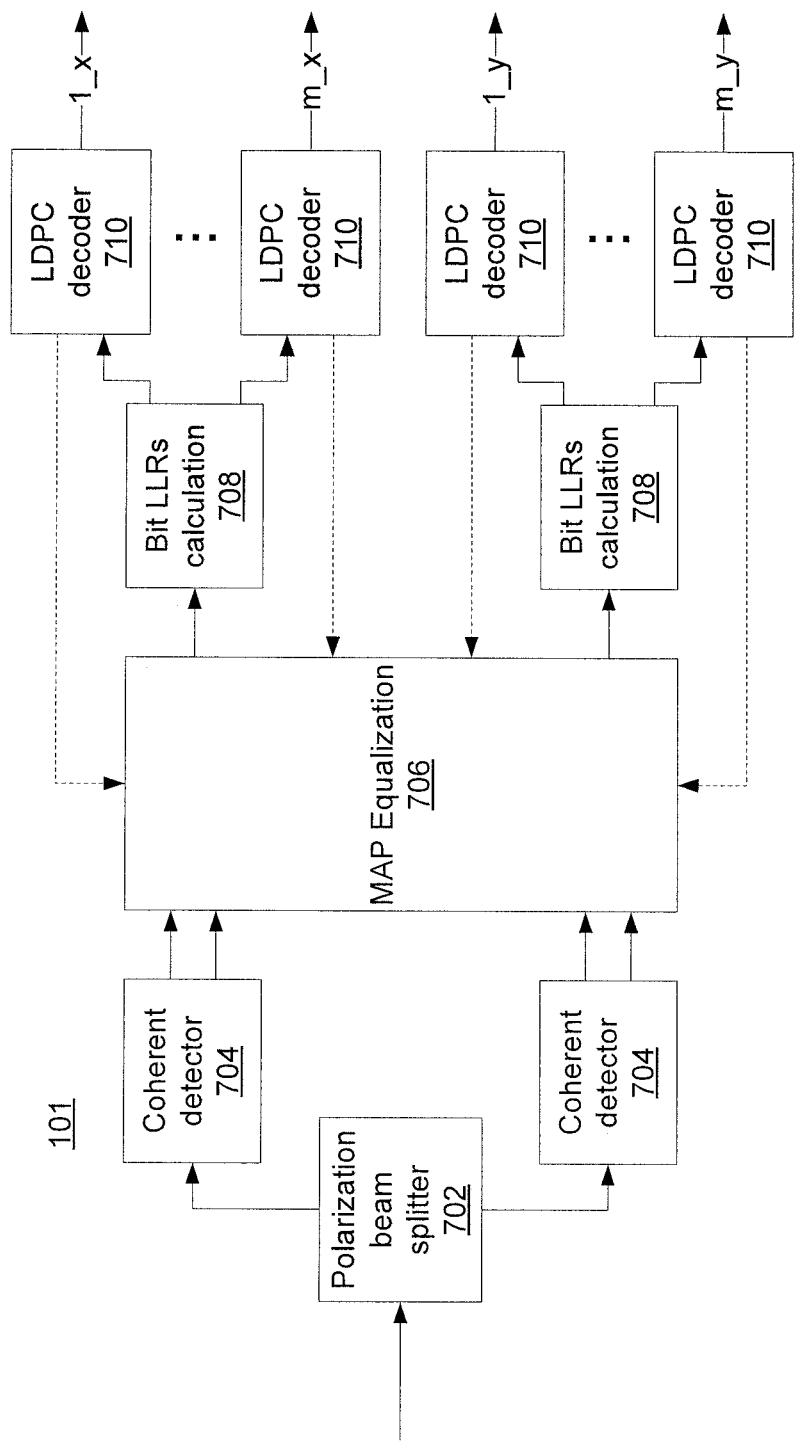
FIG. 7 shows a block diagram illustrating an optical receiver that decodes LDPC codes in accordance with one illustrative embodiment.

Referring now to FIG. 7, a detailed view of the receiver 101 is shown. Although this receiver is described in the context of an optical system, it is contemplated that the present principles may also be implemented in alternative systems such as electrical, coaxial, and other non-optical communications technologies by those having ordinary skill in the art. A carrier beam is received from an optical fiber and is split at beam splitter 702 into two orthogonal polarizations. Detectors 704 perform demodulation to produce I and a Q signal estimates. Although detectors 704 are advantageously implemented as coherent detectors, it is contemplated that other sorts of detector might be used. In embodiments that employ coherent detection, a local laser source (not shown) is used to provide the detectors 704 with a local reference that allows them to quickly distinguish between the orthogonal polarizations, and for clock recovery.

The I and Q signals produced by the detectors 704 then pass to the MAP equalization module 706, where various channel impairments are compensated for. The data stream is then passed to bit log likelihood ratio (LLR) modules 708. The bit LLR modules 708 determine the bit LLRs from symbol LLRs. The bit LLR modules 708 include a lookup table that stores the same constellation information as the lookup table at the transmitter, allowing the bit LLR modules 708 to convert symbols to bit sequences. The symbol LLRs are defined as $\lambda(s) = \log [P(s|r)/P(s_0|r)]$, where $s = (I_i, Q_i)$ and $r = (r_I, r_Q)$ denote the transmitted signal constellation point and received symbol at time instance i respectively, and $s_0$ represents the reference symbol, are determined in block 706.

The bit LLR modules 708 each produce m bit LLRs which are processed by m LDPC decoders 710 that employ an RC decoding method according to the present principles. The bit reliabilities for LDPC decoders 710 are calculated from symbol reliabilities. To improve bit error rate (BER) performance, EXIT chart analysis is used in proper selection of LDPC codes and extrinsic reliabilities are iterated between maximum a posteriori (MAP) equalizer and LDPC decoders 710 in turbo equalization fashion until convergence or until a predetermined number of iterations has been reached. The MAP equalizers form a part of the turbo equalizer in block 706. One advantageous embodiment of a MAP equalizer uses the Bahl-Cocke-Jelinek-Raviv (BCJR) method. Another uses a soft-output viterbi method (SOVA) for equalization. The LDPC decoders 710 then produce the original 2m data signals as output and feed back extrinsic LLR information to the turbo equalizers in block 706.

Figure 8:
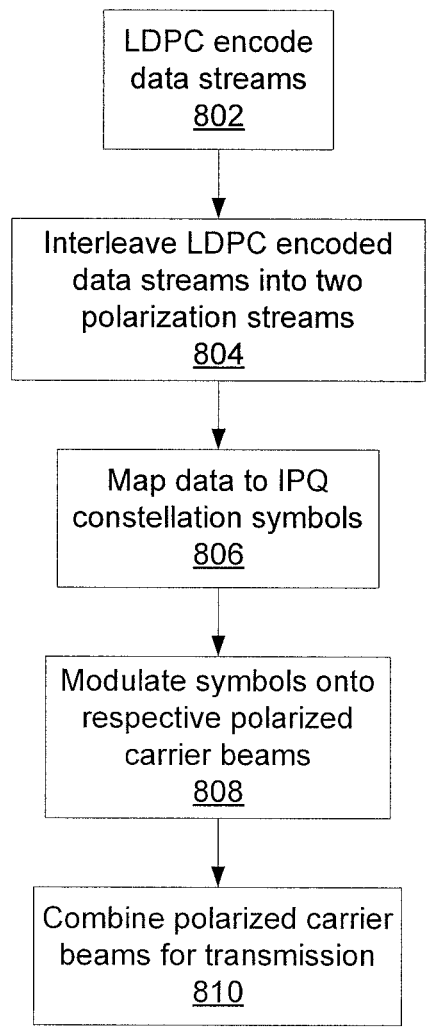
FIG. 8 shows a block/flow diagram illustrating a system/method for transmitting data using LDPC codes in accordance with one illustrative embodiment.

Referring now to FIG. 8, a system/method for encoding and modulating data for transmission using LDPC codes with IPQ modulation is shown. These methods provide for very high transmission rates, in excess of 400 Gb/s, over long distances. A plurality of data streams are encoded at block 802 using an LDPC code as described above in reference to FIG. 6. The encoded streams are then interleaved at block 804 into two separate polarization streams, representing the two orthogonal polarizations that are to be multiplexed.

The interleaved streams can then be mapped to the symbols of an IPQ constellation, such as those described above, at block 806, providing in-phase and quadrature values that identify particular symbols. The I and Q values for each set of symbols are used to modulate the symbols onto orthogonally polarized carrier beams via phase modulation at block 808 before those polarized carrier beams are combined into a single beam for transmission at block 810. The combined carrier beam can then be transmitted over an optical fiber to its destination.

Figure 9:
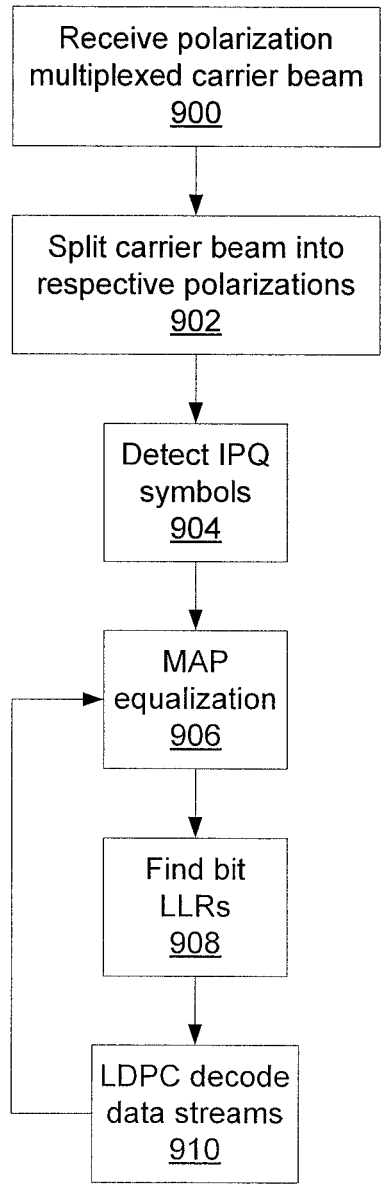
FIG. 9 shows a block/flow diagram illustrating a system/method for receiving and decoding data using LDPC codes in accordance with one illustrative embodiment.

Referring now to FIG. 9, a system/method for receiving and decoding received data is shown. A combined carrier beam is received from an optical transmission fiber at block 900 and is then split into two orthogonal polarizations at block 902. IPQ symbols are then detected and extracted from the carrier beams at block 904. It is contemplated that any method of detection could be used, but for the purposes of example and discussion coherent detection is used herein.

Channel distortions are compensated for using turbo equalization in block 906. The symbols are converted to bit streams and the bit LLRs for the streams are calculated at block 910. These bit LLRs are used to decode the LDPC encoded data at block 910 according to the RC decoding methods described above with reference to FIGS. 3 and 4. At block 912, extrinsic LLR information is passed back from the LDPC decoding to be used in subsequent turbo equalizations.

Having described preferred embodiments of a system and method for reduced-complexity LDPC decoding (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for decoding low-density parity-check (LDPC) information, comprising:
    receiving an encoded input stream; and
    decoding the encoded input stream with one or more reduced-complexity min-sum LDPC decoders comprising:
        initializing variable-nodes based on channel reliabilities;
        performing attenuated check-node updates for one or more check nodes based on said variable-node reliabilities using a processor;
        skipping variable-node updates to improve decoding performance; and
        improving decoder performance based on additional attenuated check-node updates.

2. The method of claim 1, wherein decoding the encoded input stream further comprises testing for convergence by checking whether $$zH^T = 0,$$

where z is a vector of hard decisions and H is a LDPC parity check matrix.

3. The method of claim 1, wherein decoding the encoded input stream further comprises computing messages $L_{c \to v}$ to be sent from the check-nodes to the variable-nodes as $$L_{c \to v} = \bigoplus_{N(c) \setminus \{v\}} L_{v \to c},$$

where $$L_1 \oplus L_2 = \alpha \prod_{k=1}^{2} \text{sign}(L_k) \min(|L_1|, |L_2|),$$

α is an attenuation factor, N(c)\{v} is the neighborhood of check-node c excluding variable-node v, and $L_{v \to c}$ are the messages to be sent from variable-node v to check-node c.

4. A method for decoding low-density parity-check information, comprising:
receiving an encoded input stream; and
decoding the encoded input stream with one or more reduced-complexity a posteriori probability low-density parity-check (LDPC) decoders comprising:
initializing hard decisions and variable-node magnitudes based on channel reliabilities;
performing attenuated check-node updates for one or more check nodes based on said hard decisions and magnitudes;
skipping variable-node updates to improve decoding performance; and
improving decoder performance based on additional attenuated check-node updates.

5. The receiver of claim 4, wherein decoding the encoded input stream further comprises testing for convergence by checking whether $$zH^T = 0,$$

where z is a vector of hard decisions and H is a LDPC parity check matrix.

6. The method of claim 4, wherein performing check-node updates comprises computing magnitudes to be sent from check-node c to variable-node v as:

$$m_{c \to v} = \alpha \left( \min_{N(c)\setminus\{v\}} m_v \right),$$

where α is an attenuation factor, N(c)\{v} is the neighborhood of c excluding v, and $m_v$ is the magnitude of v.

7. The method of claim 4, wherein performing check-node updates comprises computing hard decisions from check-node c to variable-node v as:

$$z_{c \to v} = \left( \sum_{N(c)\setminus\{v\}} z_v \right) \bmod 2,$$

where α is an attenuation factor, N(c)\{v} is the neighborhood of c excluding v, and $z_v$ is the hard decision of v.

8. The method of claim 4, wherein performing check-node updates comprises updating variable-node magnitudes as $$m_v = |L_{ch}(v)| + \sum_{N(c)} (1 - 2z_{c \to v}) m_{c \to v},$$

where $L_{ch}(v)$ is the channel log-likelihood ratio for variable node v, N(c) is the neighborhood of check-node c, $z_{c \to v}$ is the hard decision from c to v, and $m_{c \to v}$ is the magnitude from c to v.

9. A receiver, comprising:
a detector configured to receive an input stream and produce a stream of samples corresponding to encoded bits; and
one or more reduced-complexity min-sum low-density parity-check (LDPC) decoders configured to initialize variable-nodes based on channel reliabilities, to perform attenuated check-node updates for one or more check nodes based on said variable-node reliabilities to decode the encoded bits, to skip variable-node updates to improve decoding performance, and to perform additional attenuated check-node updates to improve decoder performance.

10. The receiver of claim 9, wherein the one or more decoders are further configured to test for convergence by checking whether $$zH^T = 0,$$

where z is a vector of hard decisions and H is a LDPC parity-check matrix.

11. The receiver of claim 9, wherein the one or more decoders are further configured to compute messages $L_{c \to v}$ to be sent from the check-nodes to the variable-nodes as $$L_{c \to v} = \bigoplus_{N(c)\setminus\{v\}} L_{v \to c},$$

where $$L_1 \oplus L_2 = \alpha \prod_{k=1}^{2} \text{sign}(L_k) \min(|L_1|, |L_2|),$$

α is an attenuation factor, N(c)\{v} is the neighborhood of check-node c excluding variable-node v, and $L_{v \to c}$ are the messages to be sent from variable-node v to check-node c.

12. A receiver, comprising:
a detector configured to receive an input stream and produce the samples that correspond to encoded bits;
one or more reduced-complexity a posteriori probability (APP) low-density parity-check (LDPC) decoders configured to initialize hard decisions and variable-node magnitudes based on channel reliabilities, to perform attenuated check-node updates for one or more check nodes based on said hard decisions and variable-node magnitudes to decode the encoded bits, to skip variable-node updates to improve decoding performance, and to perform additional attenuated check-node updates to improve decoder performance.

13. The receiver of claim 12, wherein the one or more decoders are further configured to test for convergence by checking whether $$zH^T = 0,$$

where z is a vector of hard decisions and H is a LDPC parity check matrix.

14. The receiver of claim 12, wherein the one or more decoders are further configured to compute magnitudes to be sent from check-node c to variable-node v as:

$$m_{c \to v} = \alpha \left( \min_{N(c)\setminus\{v\}} m_v \right),$$

where $\alpha$ is an attenuation factor, $N(c)\setminus\{v\}$ is the neighborhood of check-node c excluding variable-node v, and $m_v$ is the magnitude of variable-node v.

15. The receiver of claim 12, wherein the one or more decoders are further configured to compute hard decisions from check-node c to variable-node v as:

$$z_{c \to v} = \left( \sum_{N(c)\setminus\{v\}} z_v \right) \bmod 2,$$

where $\alpha$ is an attenuation factor, $N(c)\setminus\{v\}$ is the neighborhood of c excluding variable-node v, and $z_v$ is the hard decision of v.

16. The receiver of claim 12, wherein the one or more decoders are further configured to update variable-node magnitudes as $$m_v = |L_{ch}(v)| + \sum_{N(c)} (1 - 2z_{c \to v}) m_{c \to v},$$

where $L_{ch}(v)$ is the channel log-likelihood ratio for variable node v, $N(c)$ is the neighborhood of check-node c, $z_{c \to v}$ is the hard decision from c to v, and $m_{c \to v}$ is the magnitude from c to v.

* * * * *